US012793773B2

(12) United States Patent
Nguyen et al.

(10) Patent No.: US 12,793,773 B2
(45) **Date of Patent: *Nov. 10, 2026**

(54) ReRAM MEMORY ARRAY THAT INCLUDES ReRAM MEMORY CELLS HAVING A ReRAM DEVICE AND TWO SERIES-CONNECTED SELECT TRANSISTORS THAT CAN BE SELECTED FOR PROGRAMMING

(71) Applicant: Microsemi SoC Corp., Chandler, AZ (US)

(72) Inventors: Victor Nguyen, San Ramon, CA (US); Fethi Dhaoui, Mountain House, CA (US); John L McCollum, Orem, UT (US); Fengliang Xue, San Jose, CA (US)

(73) Assignee: Microsemi SoC Corp., Chandler, AZ (US)

(*) Notice: Subject to any disclaimer, the term of this patent is extended or adjusted under 35 U.S.C. 154(b) by 126 days.

This patent is subject to a terminal disclaimer.

(21) Appl. No.: 18/913,162

(22) Filed: Oct. 11, 2024

(65) Prior Publication Data

US 2025/0037764 A1 Jan. 30, 2025

Related U.S. Application Data

(60) Continuation of application No. 17/736,563, filed on May 4, 2022, now Pat. No. 12,154,622, which is a (Continued)

(51) Int. Cl.

| | |
|---|---|
| ***G11C 13/00*** | (2006.01) |
| ***H10N 70/00*** | (2023.01) |
| ***H10N 70/20*** | (2023.01) |

(52) U.S. Cl.

CPC ...... *G11C 13/0028* (2013.01); *G11C 13/0026* (2013.01); *G11C 13/0069* (2013.01);

(Continued)

(58) Field of Classification Search

CPC ........... G11C 13/0028; G11C 13/0026; G11C 13/0069; G11C 13/0097; H10N 70/8416; H10N 70/245

(Continued)

(56) References Cited

U.S. PATENT DOCUMENTS

| | | | |
|---|---|---|---|
| 9,263,127 | B1 | 2/2016 | Choi |
| 9,305,642 | B2 | 4/2016 | Oh et al. |

(Continued)

FOREIGN PATENT DOCUMENTS

| | | | |
|---|---|---|---|
| WO | 2015085093 | A1 | 6/2015 |

OTHER PUBLICATIONS

PCT/US2019/043113, International Search Report and Written Opinion of the International Searching Authority, dated Dec. 19, 2019.

(Continued)

*Primary Examiner* — Connie C Yoha

(74) *Attorney, Agent, or Firm* — Glass & Associates; Kenneth D'Alessandro; Kenneth Glass

(57) ABSTRACT

A ReRAM memory array includes ReRAM memory cells and a select circuit having first and second series-connected select transistors connected in series with a ReRAM device. When ReRAM memory cell(s) are selected for programming, the bit line coupled to the ReRAM memory cell(s) to be programmed is biased at a first voltage potential and the source line coupled to the ReRAM memory cell(s) to be programmed is biased at a second voltage potential less than the first voltage potential, the difference between the first voltage potential and the second voltage potential being sufficient to program the ReRAM device. The gates of first (Continued)

and second series-connected select transistors of ReRAM memory cell(s) to be programmed are supplied with positive voltage pulses. The gates of second series-connected select transistors of respective ReRAM memory cell(s) unselected for programming are supplied with a voltage potential insufficient to turn them on.

5 Claims, 3 Drawing Sheets

Related U.S. Application Data division of application No. 17/140,064, filed on Jan. 2, 2021, now Pat. No. 11,355,187, which is a division of application No. 16/405,895, filed on May 7, 2019, now Pat. No. 10,910,050.

(60) Provisional application No. 62/832,478, filed on Apr. 11, 2019.

(52) U.S. Cl.
CPC ....... *G11C 13/0097* (2013.01); *H10N 70/245* (2023.02); *H10N 70/8416* (2023.02)

(58) Field of Classification Search
USPC .......................................................... 365/148
See application file for complete search history.

(56) References Cited

U.S. PATENT DOCUMENTS

| | | | | |
|---|---|---|---|---|
| 9,734,882 | B2 | 8/2017 | Toh et al. | |
| 9,779,807 | B2 | 10/2017 | Pelley et al. | |
| 10,424,378 | B2 | 9/2019 | Buchanan et al. | |
| 10,553,646 | B2 | 2/2020 | McCollum | |
| 10,672,776 | B2 | 6/2020 | Chen et al. | |
| 10,755,790 | B2 | 8/2020 | Yeh et al. | |
| 10,878,905 | B1 * | 12/2020 | McCollum | G11C 13/0069 |
| 11,355,187 | B2 | 6/2022 | Nguyen et al. | |
| 11,538,524 | B2 * | 12/2022 | Dagan | G11C 13/0026 |
| 2009/0158493 | A1 | 6/2009 | Kim | |
| 2009/0168493 | A1 | 7/2009 | Kim et al. | |
| 2016/0064452 | A1 | 3/2016 | Ueda et al. | |
| 2019/0006415 | A1 | 1/2019 | Li et al. | |
| 2019/0051352 | A1 | 2/2019 | McCollum | |
| 2019/0080753 | A1 | 3/2019 | Tran et al. | |
| 2019/0221259 | A1 | 7/2019 | McCollum | |
| 2020/0327938 | A1 * | 10/2020 | Xue | G11C 13/003 |

OTHER PUBLICATIONS

PCT/US2019/043113, International Search Report and Written Opinion of the International Searching Authority, mailed Dec. 19, 2019.

* cited by examiner

| | Read | Pgm | Pgm Inhibit | Erase | Erase Inhibit |
|---|---|---|---|---|---|
| WLA (42) | 1V | 2.4V* | 1.2V | 1.8V* | 0V |
| WLB (44) | 1V | 2.0V* | 0V | 1.8V* | 1.2V |
| BL (38) | 0.3V/0V | 2.4V | 2.4V | 0V | 0V |
| SL (40) | 0V | 0V | 0V | 1.8V | 1.8V |
*Multiple pulses @1μSec with interleaved Read Cycles
FIG. 4
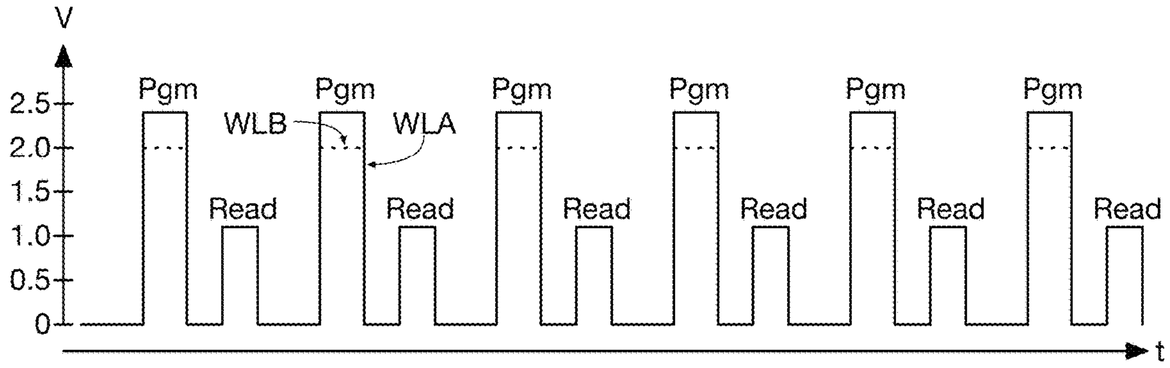
FIG. 5A
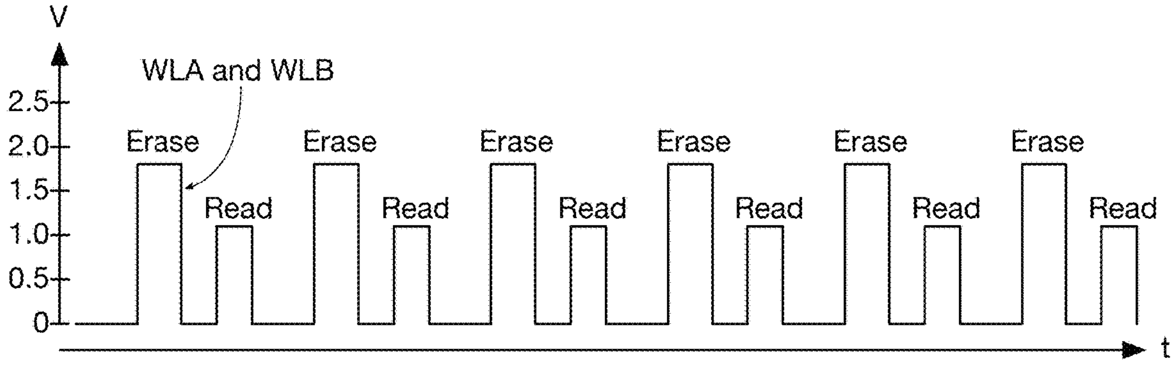
FIG. 5B

ReRAM MEMORY ARRAY THAT INCLUDES ReRAM MEMORY CELLS HAVING A ReRAM DEVICE AND TWO SERIES-CONNECTED SELECT TRANSISTORS THAT CAN BE SELECTED FOR PROGRAMMING

CROSS-REFERENCE TO RELATED APPLICATIONS

The present application is a continuation of U.S. Non-Provisional patent application Ser. No. 17/736,563 filed on May 4, 2022, that is a divisional of U.S. Non-Provisional patent application Ser. No. 17/140,064 filed on Jan. 2, 2021, that is a divisional of U.S. Non-Provisional patent application Ser. No. 16/405,895 filed on May 7, 2019, that claims priority to U.S. Provisional Patent Application Ser. No. 62/832,478 filed on Apr. 11, 2019, the contents of each of which are incorporated by reference herein in their entirety.

BACKGROUND

The present invention relates to resistive random-access memory (ReRAM) cells. More particularly, the present invention relates to ReRAM memory cells having separately controlled series-connected word line select transistors.

ReRAM memory cells have found increasing applications in the semiconductor industry. ReRAM memory cells employing two series-connected word line select transistors sharing common gate connections to a word line have been used to mitigate the high-voltage stress present between the bit line and source line during ReRAM cell programming.

Referring first of all to FIG. 1, a schematic diagram shows an illustrative prior-art ReRAM memory cell depicted within dashed lines 10. The ReRAM memory cell 10 includes a ReRAM device 12 connected in series with first and second series-connected select transistors 14 and 16. A ReRAM device includes a first conductive metal electrode serving as an ion source, a layer of a solid electrolyte material, and a second conductive electrode. A ReRAM device may be programmed by applying a programming potential across the first and second electrodes having a magnitude sufficient to cause ions of the material from which the first electrode is formed to migrate from the first electrode into the layer of solid electrolyte material to form a conductive path between the first and second electrodes. A ReRAM device may be erased by applying across the first and second electrodes an erase potential having a polarity opposite to that of the programming potential and having a magnitude sufficient to cause the ions to migrate from the conductive path in the layer of solid electrolyte material back to the ion source electrode. The wide end of the symbol representing the ReRAM device in all of the drawing figures herein represents the ion source electrode.

The memory cell 10 is coupled between a bit line (BL) 18 to which one terminal of the ReRAM device 12 is connected and a source line (SL) 20 to which the source of the select transistor 16 is connected. The source line 20 is common to all of the memory cells in the array. The gates of both select transistors 14 and 16 are connected together to a word line 22. In an array of such memory cells 10, the bit line 18 and the source line 20 typically run in a column direction of the array while the word line 22 typically runs in a row direction of the array.

The use of two series-connected select transistors 14 and 16 presents no additional complexity compared to a single transistor select device and efficiently mitigates high-voltage stress that exists between the bit line (BL) 18 and the source line (SL) 20 nodes during program and erase operations.

One problem that is encountered in the prior-art ReRAM memory cell 10 of FIG. 1 is that of gate induced drain leakage (GIDL) in the select transistors in memory cells that are unselected during ReRAM memory cell program and erase operations. GIDL is a leakage current that occurs due to a high electric field between the gate and drain terminals. Because the gates of transistors 14 and 16 are connected together, a gate voltage of 0V is required to turn both transistors 14 and 16 off for unselected memory cells. This places the entire programming voltage across the gate to drain of the transistor 14. This will result in GIDL.

BRIEF DESCRIPTION

According to an aspect of the present invention a ReRAM memory cell includes a ReRAM memory array arranged as rows and columns forming intersections. The ReRAM memory array includes a plurality of ReRAM memory cells. The ReRAM memory cells include a ReRAM device having a solid electrolyte layer disposed between a first ion-source electrode and a second electrode and a select circuit having a first series-connected select transistor and a second series-connected select transistor connected in series with the ReRAM device. Rows of the ReRAM memory array include a first word line coupled to a gate of the first series-connected select transistors in the respective row and include a second word line coupled to a gate of the second series-connected select transistors in the respective row. Columns of the array include a bit line coupled to the first ion-source electrode of ReRAM memory cells in the respective column and a decoded source line coupled to the second series-connected select transistor of ReRAM memory cells in the respective column.

When a ReRAM memory cell of the plurality of ReRAM memory cells is selected for programming the bit line coupled to the ReRAM memory cell selected for programming is biased at a first voltage potential and the decoded source line coupled to the ReRAM memory cell selected for programming is biased at a second voltage potential less than the first voltage potential, where the difference between the first voltage potential and the second voltage potential is sufficient to program the ReRAM device in the ReRAM memory cell selected for programming. The gate of the first series-connected select transistor of the ReRAM memory cell selected for programming is supplied with positive voltage pulses having a first magnitude and the gate of the second series-connected transistor of the ReRAM memory cell selected for programming is supplied with positive voltage pulses having a second magnitude lower than the first magnitude.

When a ReRAM memory cell of the plurality of ReRAM memory cells is unselected for programming, the gate of the second series-connected select transistor of the ReRAM memory cell unselected for programming is supplied with a voltage potential insufficient to turn it on.

According to an aspect of the present invention the two series-connected select transistors are two series-connected n-channel select transistors.

According to an aspect of the present invention, the source line is a decoded source line.

According to an aspect of the present invention, the first word line and the second word line are decoded word lines.

According to an aspect of the present invention, the bit line is a decoded bit line.

According to an aspect of the present invention, a ReRAM memory array is arranged as rows and columns forming intersections and includes a plurality of ReRAM memory cells, each ReRAM memory cell including a ReRAM device having a solid electrolyte layer disposed between a first ion-source electrode and a second electrode and a select circuit having two series-connected select transistors connected in series with the ReRAM device, each of the two series-connected select transistors having a gate connected to a separate control line.

According to an aspect of the present invention, each row of the array includes a first word line connected to the control line of a first one of the series-connected select transistors of every ReRAM memory cell in the row and a second word line connected to the control line of a second one of the series-connected select transistors of every ReRAM memory cell in the row.

According to an aspect of the present invention, each column of the array includes a bit line connected to the first node of every ReRAM memory cell in the row and a decoded source line connected to the second node of every ReRAM memory cell in the row, each ReRAM device has a solid electrolyte layer disposed between a first ion-source electrode and a second electrode, the first ion-source electrode connected to the first node, and the two series-connected select transistors comprise a first n-channel select transistor connected in series with a second n-channel select transistor between the second electrode of the ReRAM device and the second node, the first n-channel select transistor having a gate connected to a first select node and the second n-channel select transistor having a gate connected to a second select node.

According to an aspect of the present invention, each row of the array includes a first word line connected to the gate of the first n-channel select transistor of every ReRAM memory cell in the row and a second word line connected to the gate of the first n-channel select transistor of every ReRAM memory cell in the row.

According to an aspect of the present invention, each column of the array includes a bit line connected to the first node of every ReRAM memory cell in the row and a decoded source line connected to the second node of every ReRAM memory cell in the row.

According to an aspect of the present invention a method is disclosed for programming a ReRAM memory cell that includes a ReRAM device including a solid electrolyte layer disposed between a first ion-source electrode at a bit line node and a second electrode and a select circuit including two series-connected select transistors connected in series with the ReRAM device at its second electrode to a source line node, each of the two series-connected select transistors having a gate connected to a separate control line. The method includes determining if the ReRAM cell is selected for programming, if the ReRAM cell is selected for programming, biasing the bit line node at a first voltage potential, biasing the source line node at a second voltage potential less than the first voltage potential, the difference between the first voltage potential and the second voltage potential being sufficient to program the ReRAM device in the ReRAM cell, and supplying the gate of the one of the series-connected transistors having its source connected to the source line node with positive voltage pulses having a first magnitude, and supplying the gate of the other one of the series-connected transistors with positive voltage pulses having a second magnitude higher than the first magnitude, and if the ReRAM cell is unselected for programming, supplying the gate of the one of the series-connected transistors having its source connected to the source line node with a voltage potential insufficient to turn it on.

According to an aspect of the present invention a method is disclosed for erasing a ReRAM memory cell that includes a ReRAM device including a solid electrolyte layer disposed between a first ion-source electrode at a bit line node and a second electrode and a select circuit including two series-connected select transistors connected in series with the ReRAM device at its second electrode to a source line node, each of the two series-connected select transistors having a gate connected to a separate control line. The method includes determining if the ReRAM cell is selected for erasing, if the ReRAM cell is selected for erasing, biasing the bit line node at a first voltage potential, biasing the source line node at a second voltage potential greater than the first voltage potential, the difference between the first voltage potential and the second voltage potential being sufficient to erase the ReRAM device in the ReRAM cell, and supplying the gates of the series-connected transistors with positive voltage pulses, and if the ReRAM cell is unselected for erasing, supplying the gate of the one of the series-connected transistors having its drain connected to the second electrode of the ReRAM device with a voltage potential insufficient to turn it on.

BRIEF DESCRIPTION OF THE DRAWING FIGURES

The invention will be explained in more detail in the following with reference to embodiments and to the drawing in which are shown:

FIG. 4 is a table showing exemplary voltage potentials applied to the ReRAM memory cells of the present invention during its various modes of operation;

FIG. 5A is a waveform diagram showing an exemplary programming pulse sequence used to program ReRAM memory cells; and FIG. 5B is a waveform diagram showing an exemplary erase pulse sequence used to erase ReRAM memory cells.

DETAILED DESCRIPTION

Persons of ordinary skill in the art will realize that the following description is illustrative only and not in any way limiting. Other embodiments will readily suggest themselves to such skilled persons.

Figure 2:
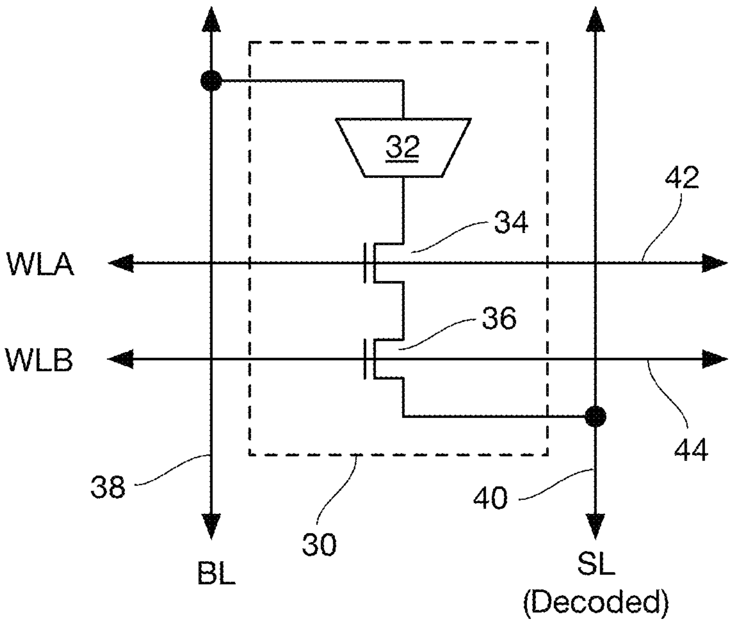
FIG. 2 is a schematic diagram of an illustrative ReRAM memory cell in accordance with an aspect of the present invention.

Referring now to FIG. 2, a schematic diagram shows an illustrative ReRAM memory cell in accordance with an aspect of the present invention depicted within dashed lines 30. The ReRAM memory cell 30 includes a ReRAM device 32 connected in series with first and second series-connected select transistors 34 and 36. The memory cell 30 is coupled between a bit line (BL) 38 to which one terminal of the ReRAM device 32 (a “bit line node”) is connected and a source line (SL) 40 to which the source of the select transistor 36 (a “source line node”) is connected. The source line (SL) 40 is a decoded source line and is addressed by a source line decoder as will be seen with reference to FIG. 3. The reason for decoding the source line (SL) 40 is to avoid stressing the ReRAM memory cells 30 connected to bit lines in columns of the array not being programmed or erased during a programming or erase operation. The gate of the select transistor 34 is connected to a word line (WLA) 42. The gate of the select transistor 36 is connected to a word line (WLB) 44. Providing separate control of the gates of select transistors 34 and 36 in accordance with the present invention provides a distinct advantage. In an array of such memory cells 30, the bit line 38 and the source line 40 typically run in a column direction of the array while the word lines 42 and 44 typically run in a row direction of the array.

Figure 3:
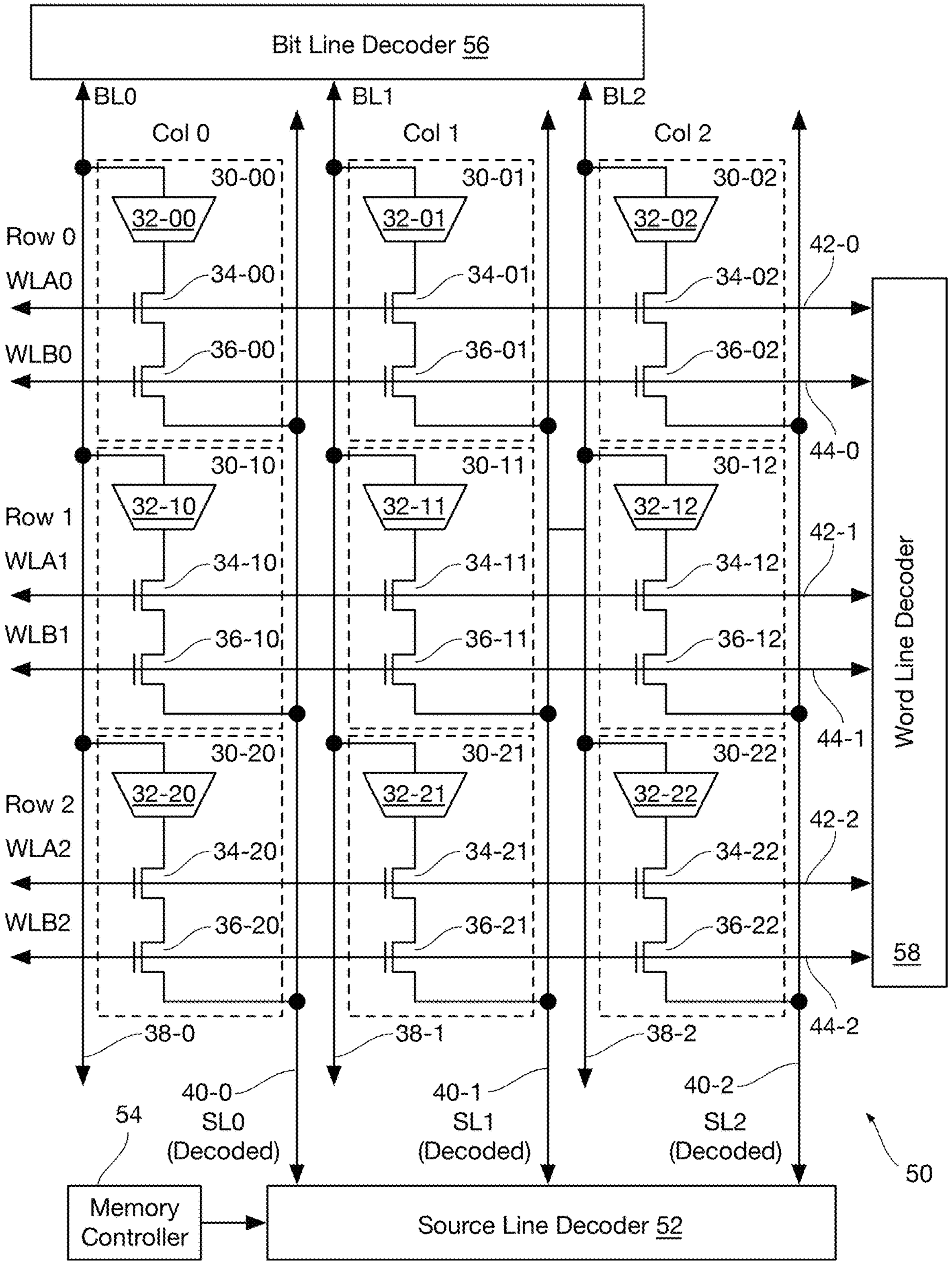
FIG. 3 is a schematic diagram of an illustrative array of ReRAM memory cells in accordance with an aspect of the present invention.

Referring now to FIG. 3, a schematic diagram depicts an illustrative array 50 of ReRAM memory cells in accordance with an aspect of the present invention. The array 50 is shown having three rows and three columns for purposes of illustration. Persons of ordinary skill in the array will appreciate that arrays of arbitrary sizes are within the scope of the present invention.

The first row of the array 50 includes ReRAM memory cells 30-00, 30-01, and 30-02 shown inside dashed lines. The second row of the array 50 includes ReRAM memory cells 30-10, 30-11, and 30-12 shown inside dashed lines. The third row of the array 50 includes ReRAM memory cells 30-20, 30-21, and 30-22 shown inside dashed lines. The first column of the array includes ReRAM memory cells 30-00, 30-10, and 30-20. The second column of the array includes ReRAM memory cells 30-01, 30-11, and 30-21. The third column of the array includes ReRAM memory cells 30-02, 30-12, and 30-22.

ReRAM memory cells 30-00, 30-10, and 30-20 in the first column of the array are connected between bit line (BL0) 38-0 and source line (SL0) 40-0. ReRAM memory cells 30-01, 30-11, and 30-21 in the second column of the array are connected between bit line (BL1) 38-1 and source line (SL1) 40-1. ReRAM memory cells 30-02, 30-12, and 30-22 in the third column of the array are connected between bit line (BL2) 38-2 and source line (SL2) 40-2.

The gates of the select transistors 34-00, 34-01, and 34-02 in ReRAM memory cells 30-00, 30-01, and 30-02, respectively, in the first row of the array are connected to word line (WLA0) 42-0. The gates of the select transistors 36-00, 36-01, and 36-02 in ReRAM memory cells 30-00, 30-01, and 30-02, respectively, in the first row of the array are connected to word line (WLB0) 44-0.

The gates of the select transistors 34-10, 34-11, and 34-12 in ReRAM memory cells 30-10, 30-11, and 30-12, respectively, in the second row of the array are connected to word line (WLA1) 42-1. The gates of the select transistors 36-10, 36-11, and 36-12 in ReRAM memory cells 30-10, 30-11, and 30-12, respectively, in the second row of the array are connected to word line (WLB1) 44-1.

The gates of the select transistors 34-20, 34-21, and 34-22 in ReRAM memory cells 30-20, 30-21, and 30-22, respectively, in the third row of the array are connected to word line (WLA2) 42-2. The gates of the select transistors 36-20, 36-21, and 36-22 in ReRAM memory cells 30-20, 30-21, and 30-220, respectively, in the third row of the array are connected to word line (WLB2) 44-2.

A source line decoder 52 drives the source lines 40-0, 40-1, and 40-2 to the voltages necessary to enable the operations of the memory cells in the array in the various modes of operation. The operation of the source line decoder 52 is directed by a memory controller 54. The addresses provided to the source line decoder 52 may be the same addresses provided to a bit line decoder 56 used to drive and sense the bit lines 38-0, 38-1, and 38-2. A word line decoder 58 drives the word lines 42-0, 42-1, 42-2, 44-0, 44-1, and 44-2 to the voltages necessary to enable the operations of the memory cells in the array in the various modes of operation. The operation of the bit line decoder 56 and word line decoder 58 are directed by the memory controller 54 (connection omitted for simplicity). The circuitry internal to the source line decoder 52, the memory controller 54, the bit line controller 56, and the word line controller 58 are easily configured by persons of ordinary skill in the art having knowledge of memory array control circuits and the various potentials that need to be applied to the memory cells during the various modes of operation set forth herein. Exemplary potentials are set forth in the table of FIG. 4.

Referring now to FIG. 4, a table shows exemplary voltage potentials applied to the ReRAM memory cells of the present invention during its various modes of operation including Read, Program, Program Inhibit, Erase and Erase Inhibit. Persons of ordinary skill in the art will appreciate that the voltage values given in the table of FIG. 4 provide general guidance in the operation of the ReRAM memory cells of the present invention and that exact values for any actual array of ReRAM memory cells according to the present invention will depend on device geometries and design considerations, as well as particular fabrication steps and processes.

FIGS. 5A and 5B are waveform diagrams showing an exemplary programming pulse sequence used to program and erase ReRAM memory cells, respectively. FIG. 5A shows an exemplary programming pulse sequence used to program ReRAM memory cells, and FIG. 5B shows an exemplary pulse sequence used to erase ReRAM memory cells. The different voltages applied to the word lines WLA (42) and WLB (44) during programming are shown as solid lines (WLA) and dashed lines (WLB) in FIG. 5A. The single trace in FIG. 5B reflects the fact that both word lines WLA (42) and WLB (44) are driven to the same voltage (1.8V) during erase.

The Read column of the table of FIG. 4 shows exemplary potentials applied to the various inputs of the ReRAM memory cell during a read operation. The decoded source line 40 is set to 0V. The word lines WLA 42 and WLB 44 for the row selected for reading are both driven to 1V. The voltage at the bit line 38 is sensed. The bit line 38 is clamped at a voltage limited to about 0.3V. If the ReRAM device in the memory cell is in a programmed (low impedance) state, the voltage at the bit line 38 will be pulled down to close to 0V since the select transistors are both in an on condition. If the ReRAM device in the memory cell is in an erased (high impedance) state, the voltage at the bit line 38 will remain at a level close to the 0.3V clamp value. The word lines WLA 42 and WLB 44 for unselected rows are both driven to 0V so as to keep the respective select transistors 34, 36 in an off state.

The Pgm column of the table of FIG. 4 shows exemplary potentials applied to the various inputs of the ReRAM memory cell during a programming operation. Programming is controlled on a row basis in the array. There are numerous ways to program a ReRAM device. FIG. 5 shows one particular exemplary method in which a series of programming pulses are provided to both the word lines WLA 42 and WLB 44 of a selected row. In the example of FIGS. 4 and 5, the bit lines 38 are driven to 2.4V and the decoded source line is set to 0V. The word line WLA 42 of the selected row is driven by a series of 2.4V programming pulses interleaved with 1V read pulses during which the resistance of the ReRAM device is measured. The word line WLB 44 of the selected row is driven by a series of 2.0V programming pulses interleaved with 1V read pulses during which the resistance of the ReRAM device is measured. In the example of FIG. 5A, the programming pulses are continued until the resistance of the ReRAM device 12 reaches a predetermined level to indicate that it has been successfully programmed. There is no requirement that the actual resistance of the ReRAM device 12 be measured, and a comparison against a predetermined threshold is sufficient, where resistance less than the predetermined threshold is used to indicate that it has been successfully programmed. By applying different programming pulse voltages to the word lines WLA 42 and WLB 44 in cells to be programmed, the impedances of the transistors 34 and 36 are kept approximately equal and both transistors 34 and 36 dissipate approximately the same power. In other words, the amplitude of the pulse voltages are selected so that approximately the same power is dissipated by each of transistors 34 and 36.

The Pgm Inhibit column of the table of FIG. 4 shows exemplary potentials applied to the various inputs of the ReRAM memory cell 30 during a programming operation where the ReRAM memory cell 30 is to be inhibited from being programmed. Programming is controlled on a row basis in the array and the word lines WLB 44 in rows containing ReRAM devices that are to remain unprogrammed are set to 0V to inhibit programming. The word lines WLA 42 are set to 1.2V, which, as will be described further, is a non-limiting embodiment of particular voltage which ensures that gate to drain voltage of both transistors 34 and 36 is approximately equal and is approximately half of the applied programming voltage. The bit line and source line voltages are set to the same levels as in the Pgm column. The transistor 36 is turned off because its gate is at 0V. The drain voltage at transistor 36 is set by the gate voltage at the transistor 34 and is limited to the gate to source voltage of the transistor 34 which in the present non-limiting embodiment is less than about 0.2V. Under these conditions, the gate to drain voltage of both transistors 34 and 36 is approximately equal and is approximately half of the applied programming voltage. This reduces the electric field that causes GIDL to be approximately equal in both transistors 34 and 36 and thus about half of what it would be on transistor 14 in the prior-art cell of FIG. 1.

The Erase column of the table of FIG. 4 shows exemplary potentials applied to the various inputs of the ReRAM memory cell during an erase operation. Like programming, erasing is controlled on a row basis in the array. In the example in the table of FIG. 4, the bit lines 38 are driven to 0V and the decoded source line is set to 1.8V. The word lines WLA 42 and WLB 44 in a row selected for erase are both driven by a series of 1.8V erase pulses to provide maximum current flow through both transistors 34 and 36. The erase pulses are interleaved with 1V read pulses during which the resistance of the ReRAM device is measured. In the example of FIG. 5B, the erase pulses are continued until the resistance of the ReRAM device 12 reaches a predetermined level to indicate that it has been successfully erased. There is no requirement that the actual resistance of the ReRAM device 12 be measured, and a comparison against a predetermined threshold is sufficient, where resistance greater than the predetermined threshold is used to indicate that it has been successfully erased. There is no reason to apply different voltages to the gates of the two transistors 34 and 36 because there is no GIDL condition present while a ReRAM memory cell is being erased since the gate-to-drain voltage of both transistors 34 and 36 in a ReRAM memory cell being erased in the present embodiments is about 0.6V.

The Erase Inhibit column of the table of FIG. 4 shows exemplary potentials applied to the various inputs of the ReRAM memory cell during an erase operation where the ReRAM memory cell is to be inhibited from being erased. Erasing is controlled on a row basis in the array and the word lines WLA 42 in rows containing ReRAM devices that are to be inhibited from being erased are set to 0V to inhibit erasing. The word lines WLB in rows containing ReRAM devices that are to be inhibited from being erased are set in this non-limiting embodiment to 1.2V. The bit line and source line voltages are set to the same levels as in the Erase column. By setting word lines WLB2 to 1.2V, the erase voltage is divided approximately equally between transistors 34 and 36 and GIDL is inhibited in transistor 36. The particular voltage to be applied to WLB2 during erase is selected so that the erase voltage is divided approximately equally between transistors 34 and 36.

The use of two series-connected NMOS transistors 34 and 36 whose gates are driven to different voltages by separate word lines reduces the GIDL problem during program inhibit and erase inhibit. By applying different programming pulse voltages to the word lines WLA 42 and WLB 44 in cells to be programmed, the impedances of the transistors 34 and 36 are kept approximately equal and dissipate approximately the same power.

The use of two series-connected NMOS transistors driven by separate word lines also provides a reduction of gate induced drain leakage (GIDL) in the select transistors during the program inhibit and erase inhibit operations. This allows for targeted gate voltage control for significant reduction in GIDL for the unselected cutoff paths. Lower GIDL translates to lower overall power consumption during programming and erasing operations and higher sensing accuracy during read operations.

Figure 1:
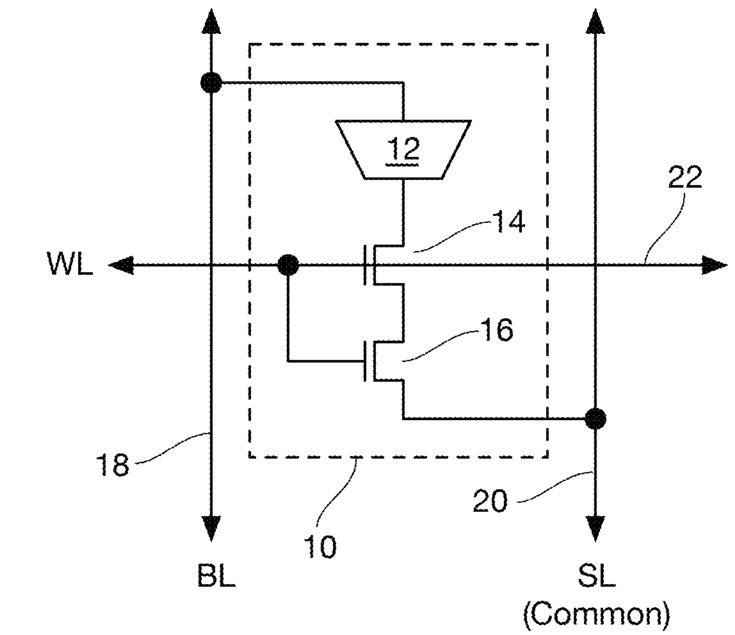
FIG. 1 (Prior Art)
FIG. 1 is a schematic diagram of an illustrative prior-art ReRAM memory cell.

In the program inhibit case, setting the WLA voltage to 1.2V reduces the magnitude of the electric field between the gate and drain of NMOS transistor 34 in FIG. 2 as compared to the prior-art cell depicted in FIG. 1, which results in significantly lower GIDL. In addition, this biasing scheme effectively divides the voltage between the bit line (BL) 38 and the source line (SL) 40, limiting the maximum voltage exposure for each of the series-connected transistors 34 and 36.

In the erase inhibit case, setting the WLB voltage to 1.2V reduces the magnitude of the electric field between the gate and source of NMOS transistor 36 as compared to the prior-art cell depicted in FIG. 1, which also results in significantly lower GIDL. As was the case in the program inhibit case, this biasing scheme effectively divides the voltage between the bit line (BL) 38 and the source line (SL) 40, limiting the maximum voltage exposure for each of the series-connected transistors 34 and 36.

As indicated above, the particular voltages utilized are not meant to be limiting, and are provided merely as specific examples of appropriate voltages for certain presently available transistors.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A ReRAM memory array comprising:

a plurality of ReRAM memory cells, respective ReRAM memory cells including a ReRAM device having a solid electrolyte layer disposed between a first ion-source electrode and a second electrode and a select circuit having a first series-connected select transistor and a second series-connected select transistor connected in series with the ReRAM device, wherein respective rows of the ReRAM memory array include a first word line coupled to a gate of the first series-connected select transistors in the respective row and include a second word line coupled to a gate of the second series-connected select transistors in the respective row, wherein respective columns of the ReRAM memory array include a bit line coupled to the first ion-source electrode of the ReRAM memory cells in the respective column and a decoded source line coupled to the second series-connected select transistor of the ReRAM memory cells in the respective column, wherein, when a ReRAM memory cell of the plurality of ReRAM memory cells is selected for programming:

the bit line coupled to the ReRAM memory cell selected for programming is biased at a first voltage potential, the decoded source line coupled to the ReRAM memory cell selected for programming is biased at a second voltage potential less than the first voltage potential, the difference between the first voltage potential and the second voltage potential being sufficient to program the ReRAM device in the ReRAM memory cell selected for programming, the gate of the first series-connected select transistor of the ReRAM memory cell selected for programming is supplied with positive voltage pulses having a first magnitude, the gate of the second series-connected select transistor of the ReRAM memory cell selected for programming is supplied with positive voltage pulses having a second magnitude lower than the first magnitude, and wherein, when a ReRAM memory cell of the plurality of ReRAM memory cells is unselected for programming, the gate of the second series-connected select transistor of the ReRAM memory cell unselected for programming is supplied with a voltage potential insufficient to turn on the respective second series-connected select transistor.

2. The ReRAM memory array of claim 1 wherein the first and second series-connected select transistors are n-channel transistors.

3. The ReRAM memory array of claim 1 wherein the gates of the respective first and second series-connected select transistors of the ReRAM memory cell unselected for programming are supplied with a voltage potential such that a gate to drain voltage of the respective first and second series-connected select transistors of the ReRAM memory cell unselected for programming is approximately equal.

4. The ReRAM memory array of claim 1 wherein the first word line is connected to the gate of respective first series-connected select transistors in the respective row and the second word line is connected to the gate of respective second series-connected select transistors in the respective row.

5. The ReRAM memory array of claim 1 wherein the bit line is connected to the first ion-source electrode of respective ReRAM memory cells in the respective column and the decoded source line is connected to the second series-connected select transistor of respective ReRAM memory cells in the respective column.

* * * * *